(12) United States Patent
Nakagawa et al.

(10) Patent No.: US 10,229,867 B2
(45) Date of Patent: Mar. 12, 2019

(54) POWER SEMICONDUCTOR DEVICE

(71) Applicant: Mitsubishi Electric Corporation, Tokyo (JP)

(72) Inventors: Shinya Nakagawa, Tokyo (JP); Tomofumi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/221,198

(22) Filed: Mar. 20, 2014

(65) Prior Publication Data

US 2014/0367846 A1 Dec. 18, 2014

(30) Foreign Application Priority Data

Jun. 13, 2013 (JP) ................................. 2013-124353

(51) Int. Cl.
*H01L 23/495* (2006.01)

(52) U.S. Cl.
CPC .. *H01L 23/49541* (2013.01); *H01L 23/49562* (2013.01); *H01L 23/49575* (2013.01); *H01L 2224/48137* (2013.01); *H01L 2224/48247* (2013.01); *H01L 2924/1305* (2013.01); *H01L 2924/13055* (2013.01); *H01L 2924/13091* (2013.01); *H05K 2201/1075* (2013.01); *H05K 2201/10742* (2013.01); *H05K 2201/10787* (2013.01)

(58) Field of Classification Search
CPC ..... H01L 23/34; H01L 23/3735; H01L 24/49; H01L 23/24; H05K 1/182; H05K 2201/10742; H05K 2201/1075; H05K 2201/10787; H05K 2201/10818

USPC .................. 257/712, 713; 327/109; 361/728; 174/250

See application file for complete search history.

(56) References Cited

U.S. PATENT DOCUMENTS

| 6,542,393 | B1 * | 4/2003 | Chu ......................... G11C 5/04 257/777 |
| 6,576,983 | B1 * | 6/2003 | Fazelpour ............... H01L 23/13 257/666 |
| 2003/0183907 | A1 | 10/2003 | Hayashi et al. |
| 2004/0251528 | A1 | 12/2004 | Kikuchi et al. |

(Continued)

FOREIGN PATENT DOCUMENTS

| CN | 1723559 A | 1/2006 |
| JP | 05226803 A * | 9/1993 |

(Continued)

OTHER PUBLICATIONS

An Office Action; "Notice of First Office Action," issued by the Korean Patent Office dated Apr. 4, 2015, which corresponds to Korean Patent Application No. 10-2014-0066840 and is related to U.S. Appl. No. 14/221,198; with English language translation.

(Continued)

*Primary Examiner* — David Vu
*Assistant Examiner* — Brandon Fox
(74) *Attorney, Agent, or Firm* — Studebaker & Brackett PC

(57) ABSTRACT

A power semiconductor device includes a plurality of power chips sealed in a package to control power and an IC sealed in the package to control each of the power chips. The IC is disposed at the center part of the package in the plan view. The plurality of power chips are disposed so as to surround the IC in the plan view.

6 Claims, 3 Drawing Sheets

(56) References Cited

U.S. PATENT DOCUMENTS

| | | | |
|---|---|---|---|
| 2005/0121224 A1* | 6/2005 | Lien | H05K 1/182 |
| | | | 174/250 |
| 2005/0142694 A1* | 6/2005 | Chiou | H01L 25/105 |
| | | | 438/109 |
| 2007/0008679 A1* | 1/2007 | Takahasi | H01L 24/49 |
| | | | 361/600 |
| 2007/0181908 A1 | 8/2007 | Otremba | |
| 2007/0216011 A1 | 9/2007 | Otremba et al. | |
| 2010/0176480 A1* | 7/2010 | Senda | H01L 21/84 |
| | | | 257/501 |
| 2010/0225363 A1* | 9/2010 | Takahashi | H01L 24/49 |
| | | | 327/109 |
| 2011/0037166 A1* | 2/2011 | Ikeda | H01L 23/3735 |
| | | | 257/712 |
| 2011/0228564 A1* | 9/2011 | Uruno | H02M 1/08 |
| | | | 363/17 |
| 2012/0146205 A1 | 6/2012 | Fernando et al. | |
| 2013/0021759 A1* | 1/2013 | Zschieschang | H01L 23/3735 |
| | | | 361/728 |
| 2013/0248883 A1* | 9/2013 | Das | H01L 29/7806 |
| | | | 257/77 |
| 2013/0334672 A1* | 12/2013 | Denta | H01L 25/072 |
| | | | 257/666 |

FOREIGN PATENT DOCUMENTS

| | | |
|---|---|---|
| JP | H05-226803 A | 9/1993 |
| JP | H06-181286 A | 6/1994 |
| JP | 2004-265931 A | 9/2004 |
| JP | 2006-100751 A | 4/2006 |
| JP | 2009-071329 A | 4/2009 |
| JP | 2011-096696 A | 5/2011 |
| JP | 2012-074720 A | 4/2012 |
| JP | 2012-129489 A | 7/2012 |
| JP | 2013-055739 A | 3/2013 |
| KR | 2003-0078690 A | 10/2003 |

OTHER PUBLICATIONS

An Office Action issued by the Korean Patent Office dated Feb. 4, 2016, which corresponds to Korean Patent Application No. 10-2015-0164642 and is related to U.S. Appl. No. 14/221,198; with English language translation.

The Second Office Action issued by the Chinese Patent Office dated Feb. 17, 2017, which corresponds to Chinese Patent Application No. 201410265538.5 and is related to U.S. Appl. No. 14/221,198; with English language translation.

A First Office Action issued by the Chinese Patent Office dated Jul. 4, 2016, which corresponds to Chinese Patent Application No. 2014102655385 and is related to U.S. Appl. No. 14/221,198; with English language translation.

CN Office Action dated Nov. 14, 2017, from corresponding CN Appl No. 20140265538.5, with partial English translation, 11 pp.

KR Notice of Conclusion of Trial Examination dated Dec. 27, 2017, from corresponding KR Appl No. 10-2015-164642, with partial English translation, 19 pp.

An Office Action; "Notification of Reason(s) for Refusal," issued by the Japanese Patent Office dated Aug. 18, 2015, which corresponds to Japanese Patent Application No. 2013-124353 and is related to U.S. Appl. No. 14/221,198; with English language translation.

An Office Action; "Final Rejection," issued by the Korean Patent Office dated Oct. 27, 2015, which corresponds to Korean Patent Application No. 10-2014-0066840 and is related to U.S. Appl. No. 14/221,198; with English language translation.

An Office Action; "The Final Rejection," issued by the Korean Patent Office dated May 1, 2016, which corresponds to Korean Patent Application No. 10-2015-0164642 and is related to U.S. Appl. No. 14/221,198; with English language translation.

The Third Office Action issued by the Chinese Patent Office dated Jul. 31, 2017, which corresponds to Chinese Patent Application No. 201410265538.5 and is related to U.S. Appl. No. 14/221,198; with English language translation.

* cited by examiner

POWER SEMICONDUCTOR DEVICE

BACKGROUND OF THE INVENTION

Field of the Invention

The present invention relates to a power semiconductor device.

Description of the Background Art

A power semiconductor device functions as a power module supplying high power. The power semiconductor device is used for an inverter drive as one of main purposes. The power semiconductor device used for the inverter drive includes a plurality of power chips and an integrated circuit (IC) driving each of the power chips. The power chips are power semiconductor chips.

Miniaturization of an area of a substrate in the power semiconductor device and cost reduction are required for the power semiconductor device.

Japanese Patent Application Laid-Open No. 2012-074720 discloses a technique for reducing a size of the power semiconductor device (hereinafter, also referred to as a related technique A). Specifically, the related technique A discloses a technique for suitably packaging power chips and a control IC into one. The power chips are metal oxide semiconductor field effect transistors (MOSFETs). Japanese Patent Application Laid-Open No. 2012-074720 discloses the quad flat package (QFP) packaging power chips and control ICs with a use of the related technique A.

Unfortunately, the related technique A has problems. Specifically, in the related technique A, all of the power chips included in the power semiconductor device are intensively disposed close to one another in the package.

For this reason, in the related technique A, thermal interference between the power chips generating heat is conspicuous. As a result, in the related technique A, each power chip has extremely poor thermal dissipation properties. In other words, it is necessary to suppress the thermal interference between the power chips to improve the thermal dissipation properties of the power chips.

SUMMARY OF THE INVENTION

It is an object of the present invention to provide a power semiconductor device capable of suppressing thermal interference between power chips.

A power semiconductor device according to an aspect includes a package made of a resin. The power semiconductor device includes a plurality of power chips sealed in the package to control power and an IC sealed in the package to control each of the power chips. The IC is disposed at a center part of the package in a plan view, and the plurality of power chips are disposed so as to surround the IC in a plan view.

According to the present invention, the IC is disposed at a center part of the package in a plan view, and the plurality of power chips are disposed so as to surround the IC in a plan view. In other words, the plurality of power chips are distributed around the IC. Thus, thermal interference between each power chip can be suppressed.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
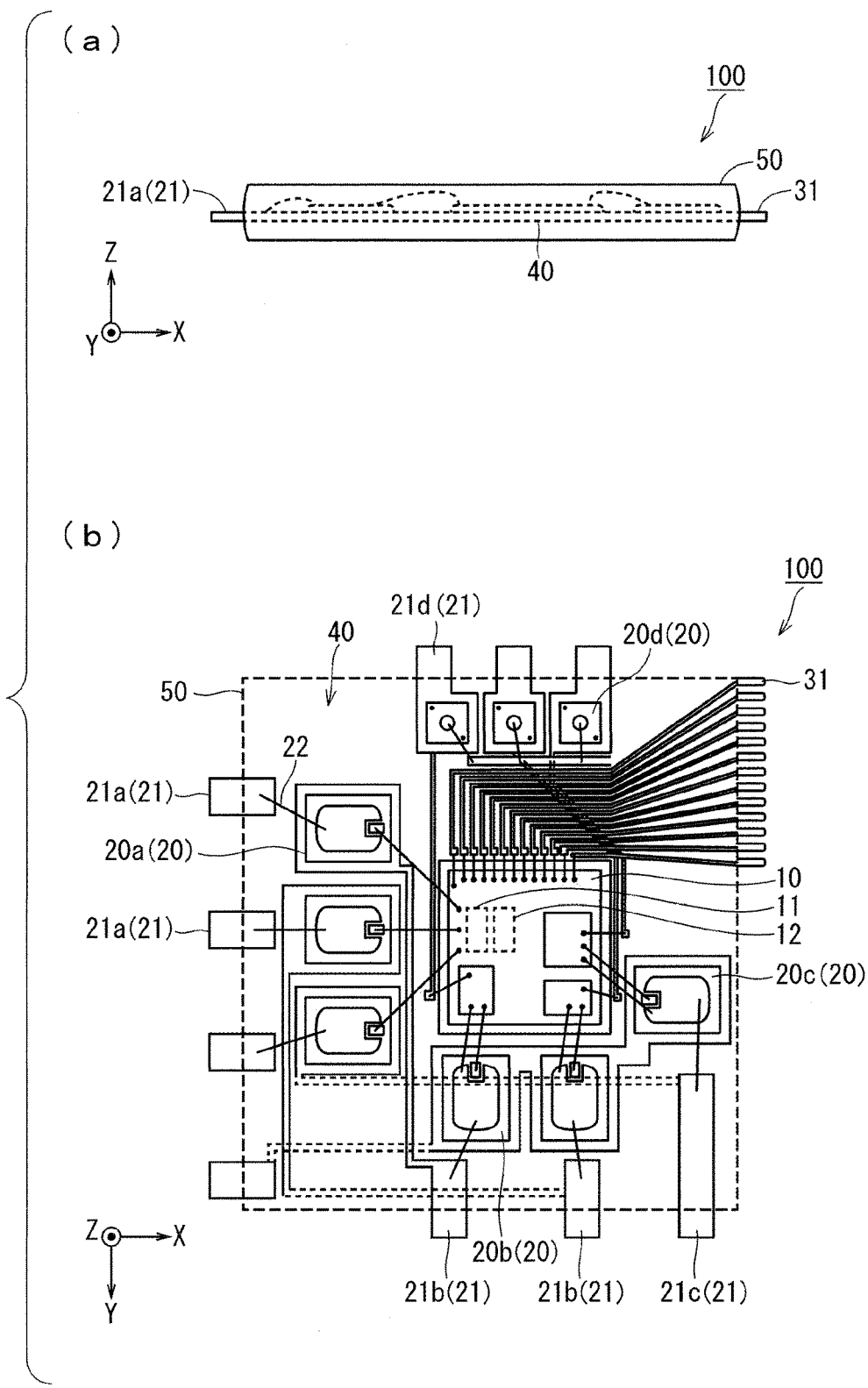
FIG. 1 is a diagram showing a power semiconductor device according to a first preferred embodiment.

A preferred embodiment of the present invention will be described below with reference to the drawings. In the following description, the same components have the same reference numerals. Their names and functions are also the same. Accordingly, their detailed description will be omitted in some cases.

Dimensions, materials, shapes, and relative positions of respective components shown as examples in the preferred embodiments are changed suitably depending on a structure of an apparatus to which the present invention is applied and various conditions and the present invention is not restricted to the examples. The dimensions of the respective components in the respective drawings may be different from actual dimensions.

First Preferred Embodiment

FIG. 1 is a diagram showing a power semiconductor device 100 according to a first preferred embodiment of the present invention. The power semiconductor device 100 is a power module that operates at a high voltage. A part (a) in FIG. 1 is a side view of the power semiconductor device 100. In the part (a) in FIG. 1, each of X, Y, and Z directions are orthogonal to one another. Moreover, in the drawings below, each of the X, Y, and Z directions are orthogonal to one another.

In the descriptions below, a direction including the X direction and an opposite direction thereof (−X direction) is also referred to as an X-axis direction. A direction including the Y direction and an opposite direction thereof (−Y direction) is also referred to as a Y-axis direction below. A direction including the Z direction and an opposite direction thereof (−Z direction) is also referred to as a Z-axis direction below.

A part (b) in FIG. 1 is a plan view showing an internal configuration of the power semiconductor device 100 according the first preferred embodiment of the present invention. The power semiconductor device 100 includes a package 50 as described above. In addition, to show the internal configuration of the package 50, the part (b) in FIG. 1 allows the package 50 to be transparent to show only an outline thereof.

As shown in the parts (a) and (b) in FIG. 1, the power semiconductor device 100 includes an IC 10, a plurality of power chips 20a, 20b, and 20d, a power chip 20c, a plurality of power terminals 21a, 21b, and 21d, a power terminal 21c, a plurality of control terminals 31, a substrate 40, and the package 50.

The power semiconductor device 100 further includes a bootstrap diode (not shown), a capacitor (not shown), and the like.

In the following descriptions, each of the power chips 20a, 20b, 20c, and 20d is collectively referred to as power chip 20. Also, each of the power terminals 21a, 21b, 21c, and 21d is collectively referred to as power terminal 21. In other words, the power semiconductor device 100 includes the plurality of power chips 20 and the plurality of power terminals 21. For example, each of the power chips 20 is formed of an insulated gate bipolar transistor (IGBT) and a diode (fly-wheel diode).

Each of the power chips 20 is not limited to the chip formed of the IBGT and the diode. For example, it may be a chip formed of a metal oxide semiconductor (MOS) transistor, a chip formed of a reverse conducting (RC)-IGBT, and the like. In other words, each of the power chips 20 is any one of the chip including the IGBT and the diode, the chip including the MOS transistor, and the chip including the RC-IGBT.

The IC 10, the power chips 20, the bootstrap diode, and the capacitor are mounted on the substrate 40. Each component (for example, the IC 10 and the power chips) mounted on the substrate 40 is sealed in the package 50. In other words, the IC 10 and the plurality of power chips 20 are sealed at least in the package 50.

The package 50 is mostly made of a resin. In other words, the package 50 is made of a resin. The resin is, for example, cured in a transfer molding method. The package 50 is, for example, generated by a resin cured in the transfer molding method.

Parts of the power terminals 21 and the control terminals 31 inside the package 50 are referred to as inner leads. Parts of the power terminals 21 and the control terminals 31 outside the package 50 are referred to as outer leads.

The plurality of power terminals 21 are supplied from the outside with power for driving the power semiconductor device 100. The power terminal 21 is configured to input and output power to and from each of the power chips 20. For example, some of the power terminals 21 supply power to the power chips 20. In other words, some of the power terminals 21 are configured to input power to the power chips 20. The other power terminal 21 is configured to output power, which is outputted from the power chips 20, to the outside.

Specifically, the power terminals 21 are electrically connected to the power chips 20 by metal wires. For example, the power terminals 21a are electrically connected to the power chips 20a by metal wires 22. With this configuration, the power chips 20a (power semiconductor device 100) is supplied with power through the power terminals 21a. In other words, each of the power chips 20 is a power semiconductor chip to control power supplied to the power semiconductor device 100.

As shown in the part (b) in FIG. 1, the plurality of power terminals 21 are each provided on three sides of four sides constituting an outer periphery of the package 50 so as to extend from the inside of the package 50 to the outside thereof.

The plurality of control terminals 31 are provided on a side of the four sides constituting the outer periphery of the package 50. In other words, each of the four sides constituting the outer periphery of the package 50 is provided with the power terminals 21 or the control terminals 31.

A configuration the plural control terminals 31 are disposed is not limited to the configuration described above. For example, the plurality of control terminals 31 may be provided on a side of the four sides constituting the outer periphery of the package 50 so as to extend from the inside of the package 50 to the outside thereof.

Each of the power chips 20 is made of a wide band gap material. The wide band gap material is, for example, silicon carbide (SiC). The wide band gap material configuring the power chips 20 is not limited to SiC and the other materials may be used.

The IC 10 controls each of the power chips 20. The IC 10 is electrically connected to each of the power chips 20 by the metal wires. The IC 10 is electrically connected to the plurality of control terminals 31 by the metal wires. Each control terminal 31 is configured to control the IC 10.

In the present preferred embodiment, the power terminals 21 have a width greater than that of the control terminals 31. For example, the width of the power terminals 21 is set to approximately 1.5 to 4 as much as that of the control terminals 31.

The IC 10 is a module of one chip including a combination of a high voltage integrated circuit (HVIC) 11 and a low voltage integrated circuit (LVIC) 12. In other words, the IC 10 is formed of the HVIC 11 and the LVIC 12. That is to say, the IC 10 includes the HVIC 11 and the LVIC 12.

The part (b) in FIG. 1 shows the HVIC 11 and the LVIC 12 clearly for convenience. For this reason, the location and the size of the HVIC 11 and the LVIC 12 are not limited to the location and the size shown in the part (b) in FIG. 1, respectively.

The HVIC 11 is, for example, a high-breakdown voltage IC capable of handling a voltage equal to or greater than 1000 (V). The LVIC 12 is an IC handling a voltage lower than the voltage handled by the HVIC 11. The HVIC 11 and the LVIC 12 are integrated circuits for controlling each of the power chips 20.

Next, the disposition of the IC 10 and the plural power chips 20 in the package 50 will be described. The IC 10 has a rectangle shape here.

In the present preferred embodiment, the IC 10 is disposed at the center part of the package 50 in the plan view. In the package 50, the plurality of power chips 20 are disposed so as to surround the IC 10 in the plan view.

In the following descriptions, each side constituting an edge of the IC 10 is referred to as an edge side. Also, all edges of the IC 10 are referred to as a whole edge. When the IC 10 has the rectangle shape, the whole edge has four edge sides.

Specifically, as shown in the part (a) in FIG. 1, in the package 50, the plurality of power chips 20 are disposed so as to surround the four edge sides of the IC 10. In other words, the power chips 20 are distributed around the IC 10.

This can reduce an effect of an interference between the thermal generated by each power chip 20. Consequently, the thermal interference between each of the power chips 20 can be suppressed. As a result, an area necessary for disposing the IC 10 and the plurality of power chips 20 to obtain a constant effect of thermal dissipation can be reduced smaller than that in the related technique A. Therefore, miniaturization (downsizing) of the power semiconductor device 100 can be achieved.

The disposition of the power chips 20 is not limited to the one shown in the part (b) in FIG. 1. For example, in the plan view, the plurality of power chips 20 may be disposed to surround the three edge sides of the IC 10. In other words, the plurality of power chips 20 may be disposed to surround the edge sides equal to or greater than three in the IC 10. Thus, the plurality of power chips 20 may be disposed to surround three or more sides of the IC 10 in the plan view.

In addition, the plurality of power chips 20 may be, for example, disposed to surround the edge which is 0.5 to 1.0 as much as the whole edge of the IC 10 in the plan view.

Next, a configuration of mounting the power semiconductor device 100 serving as the power module on a printed board is described. In the following descriptions, a state in which the power semiconductor device 100 is mounted on the printed board is also referred to as a mounting state.

First, a step of forming a hole in the printed board and a step of mounting the power semiconductor device 100 on the printed board (hereinafter, also referred to as a mounting step S1) are described with reference to FIG. 2.

Figure 2:
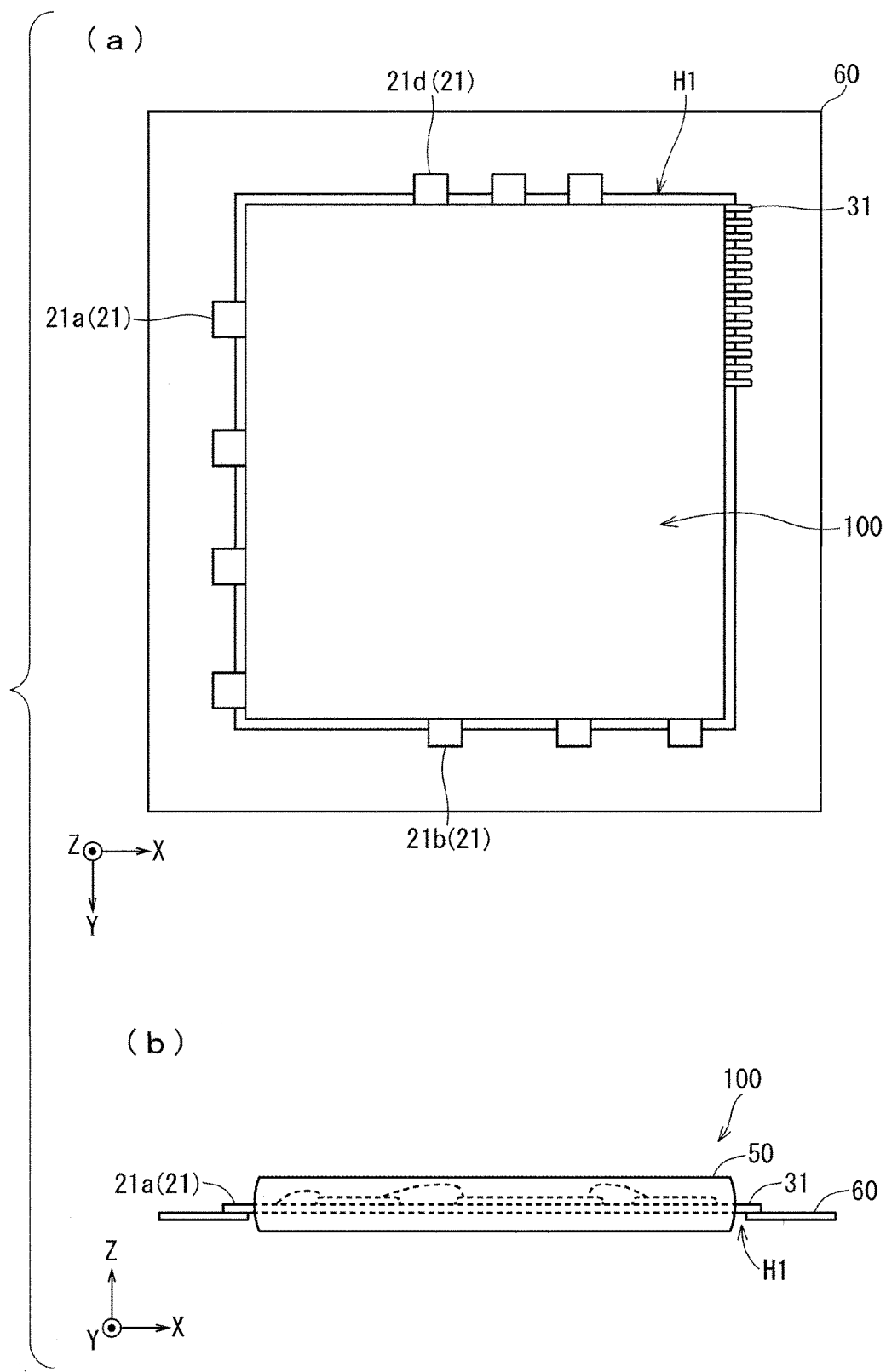
FIG. 2 is a diagram for describing a mounting state of the power semiconductor device.

FIG. 2 is a diagram for describing the mounting state of the power semiconductor device 100. A part (a) in FIG. 2 is a plan view of the mounting state of the power semiconductor device 100. A part (b) in FIG. 2 is a side view of the mounting state of the power semiconductor device 100.

Next, the mounting step S1 is described. In the mounting step S1, a printed board 60 is used. At the initial state, a hole H1 is not formed in the printed board 60.

First, a hole forming step is performed. In the hole forming step, the hole H1 is formed in the printed board 60. The hole H1 may be formed by a device for making holes or by a user. The hole H1 has a rectangle shape. The hole H1 has a greater size than that of the package 50.

Next, as shown in the part (b) in FIG. 2, the power semiconductor device 100 is mounted on the printed board 60 so as to fit a lower part of the package 50 in the hole H1. Thus, the mounting step S1 is completed.

In other words, in the mounting step S1, when mounting the power semiconductor device 100, it is not necessary for each part of the outer leads of the power terminals 21 and the control terminals 31 to be clinched (bent). In other words, without clinching the outer leads, the power semiconductor device 100 can be mounted on the printed board 60. As a result, although the hole forming step is necessary, the mounting step of the power semiconductor device 100 can be simplified.

In the mounting step S1, a configuration may use the printed board 60 with the hole H1 formed therein in advance. In a case of this configuration, the hole forming step is not necessary in the mounting step S1, and thus the mounting step of the power semiconductor device 100 can be further simplified.

Next, a configuration in which the power semiconductor device 100 is mounted on the printed board without a hole (hereinafter, also referred to as a mounting step S2) is described with reference to FIG. 3.

Figure 3:
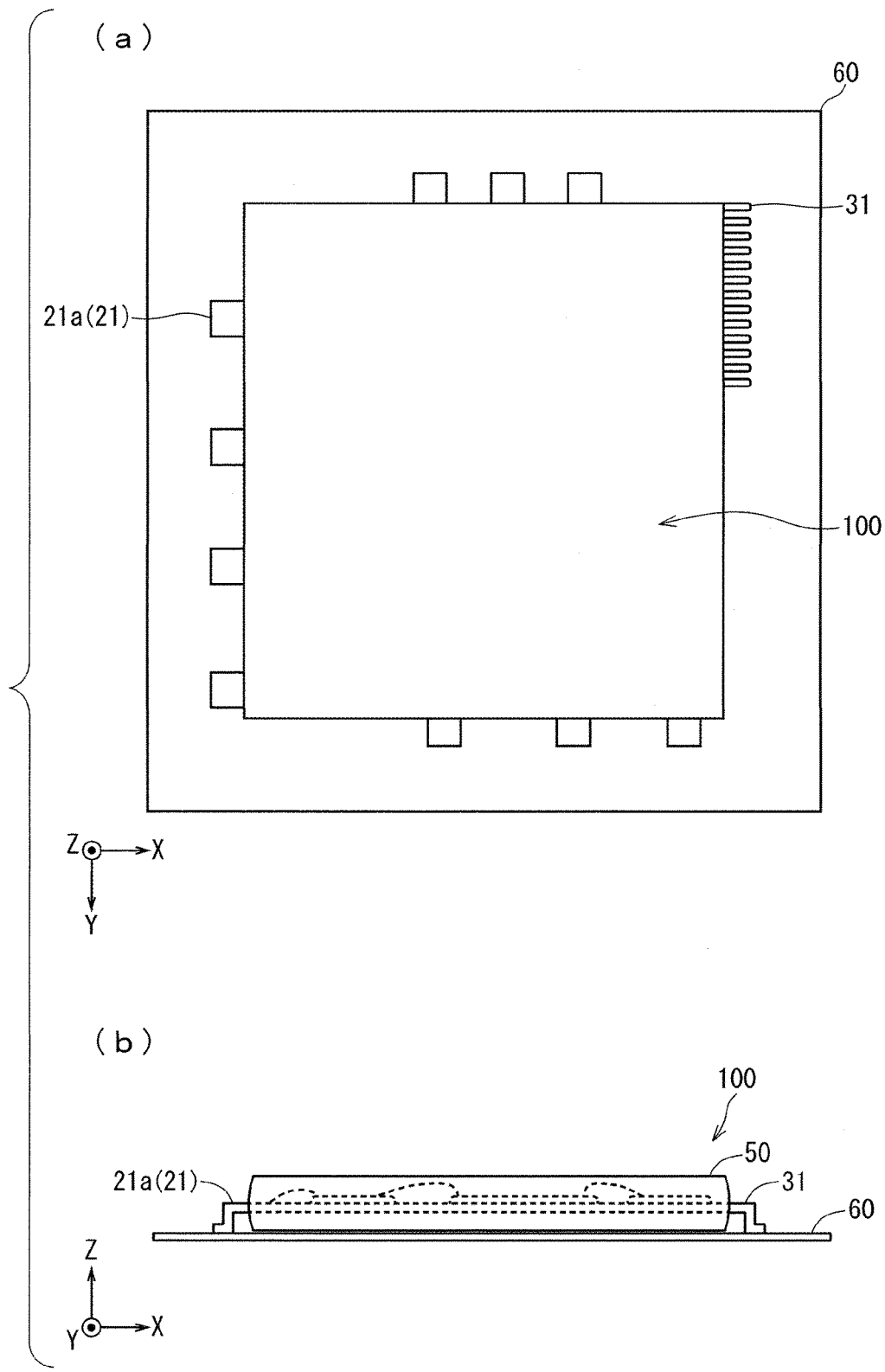
FIG. 3 is a diagram for describing another mounting state of the power semiconductor device.

FIG. 3 is a diagram for describing another mounting state of the power semiconductor device 100. In other words, FIG. 3 is the diagram for describing the mounting state of the power semiconductor device 100 different from that as shown in FIG. 2. A part (a) in FIG. 3 is a plan view showing the other mounting state of the power semiconductor device 100. A part (b) in FIG. 3 is a side view showing the other mounting state of the power semiconductor device 100. The printed board used in the mounting step S2 is the printed board 60 as shown in the parts (a) and (b) in FIG. 3.

Next, the mounting step S2 is described. In the mounting step S2, first, a bending processing step is performed. In the bending processing step, each part of the outer leads of the power terminals 21 and the control terminals 31 are clinched (bent) as shown in the part (b) in FIG. 3.

Next, the power semiconductor device 100 is mounted on the printed board 60. Thus, the mounting step S2 is completed.

In other words, in the mounting step S2 compared to the mounting step S1, although the bending processing step is necessary in addition, the hole forming step as in the mounting step S1 is unnecessary. As described above, the hole forming step of the mounting step S1 is performed by a device or a user. As a result, in the mounting step S2, it is expected that the flexibility in mounting the power semiconductor device 100 is increased and the number of manhour in the mounting step S2 is decreased.

As described above, according the present preferred embodiment, the IC 10 is disposed at the center part of the package 50 in the plan view, and the plurality of power chips 20 are disposed so as to surround the IC 10 in the plan view. In other words, the plurality of power chips 20 are distributed around the IC 10.

This can reduce an effect of an interference between the thermal generated by each power chip 20. Consequently, the thermal interference between each of the power chips 20 can be suppressed. Moreover, a rise in a temperature of each power chip 20 can be suppressed.

As a result, an area necessary for dispose the IC 10 and the plurality of power chips 20 to obtain a constant effect of thermal dissipation can be reduced smaller than that in the related technique A. Therefore, miniaturization (downsizing) of the power semiconductor device 100 can be achieved.

In the present preferred embodiment, the power chips 20 are optimally disposed on the IC 10 for controlling (driving) each of the power chips 20 and around the IC 10. A wiring process and the like are performed on the power chips 20 that are disposed, and the IC 10, the power chips 20, and the like are sealed in the resin in the transfer molding method, in order to generate the package 50. Each of four sides constituting the outer periphery of the package 50 is provided with the power terminals 21 or the control terminals 31.

As described above, the present preferred embodiment can obtain a surface mounting type module that is accomplished to be more compact than the conventional dual in-line package intelligent power module (DIPIPM).

Moreover, according to the present preferred embodiment, the power terminals 21 has a greater width than that of the control terminals 31. As described above, the width of the power terminals 21 is set to approximately 1.5 to 4 as much as that of the control terminals 31, for example. In other words, the control terminals 31 has a sufficiently smaller width than that of the power terminals 21.

For this reason, the amount of the current passing through each of the control terminals 31 can be made sufficiently smaller than that of the current passing through the power terminals 21. Thus, each control terminal 31 can have a small width to let the current having the sufficiently smaller amount than that of the terminals 21 to pass through. In other words, the miniaturization of the control terminals 31 can be achieved. As a result, a restriction on the layout of the power chips 20 by the control terminals 31 is reduced. Therefore, the miniaturization of the package 50 can be achieved.

Furthermore, the power terminals 21 has a sufficiently greater width than that of the control terminals 31. For this reason, the amount of the current passing through the power terminals 21 can be made greater than that of the control terminals 31. In other words, while the current having the great amount can pass through the power terminals 21, the current having the great amount can be supplied to each of the power chips 20.

As described above, the total amount of the current supplied to the power semiconductor device 100 can be efficiently divided in the power terminals 21 and the control terminals 31.

According to the present preferred embodiment, the IC 10 is a module of one chip including a combination of the HVIC 11 and the LVIC 12. Thus, the power for the IC 10 can be unified, and also flexibility in the layout of a pad can be increased.

Furthermore, according to the present preferred embodiment, each of the power chips 20 is made of a wide band gap material. A semiconductor chip made of a wide band gap material is capable of operating at high temperatures. Consequently, a junction temperature can be raised in the power chips 20 made of the wide band gap material. In other words, even under the high temperature environment, each of the power chips 20 is capable of operating with stability.

In the related technique A, since the package is diverted, a current capacity needs to be increased with the use of a plurality of the same leads (terminals). For this reason, in the related technique A, it is a problem that the number of components to be managed is increased when the power chips are mounted.

On the other hand, in the present preferred embodiment, the configuration as described above can solve the problems mentioned above in the related technique A.

The IC 10 includes both of the HVIC 11 and the LVIC 12 and the configuration is not limited to this. The IC 10 may include one of the HVIC 11 and the LVIC 12. Furthermore, the IC 10 may not include both of the HVIC 11 and LVIC 12.

In addition, according to the present invention, the preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device including a package made of a resin and mounted on a substrate having a hole for accommodating said package, comprising:
    a plurality of power chips sealed in said package to control power;
    an IC sealed in said package to control each of said power chips,
        said IC being disposed at a center part of said package in a plan view,
        said plurality of power chips being disposed so as to surround said IC in a plan view; and
    a plurality of terminals electrically connected to said plurality of power chips, respectively,
    said package having a plate-like shape,
    said power semiconductor device being mounted on said substrate through said plurality of terminals with a lower part of said package fitted in said hole and protruded from said hole,
    each of said plurality of terminals being straight in its entirety,
    a position of a lower surface of the package in an orthogonal direction being lower than a position of a lower surface of the substrate in the orthogonal direction, the orthogonal direction being a direction orthogonal to the lower surface of the substrate.

2. The power semiconductor device according to claim 1, wherein
    said IC has a rectangle shape, and
    said plurality of power chips are disposed to surround three or more sides of said IC in a plan view.

3. The power semiconductor device according to claim 1, further comprising:
    a control terminal that is configured to control said IC, wherein
    each of said plurality of terminals is a power terminal that is configured to input and output power to and from each of said power chips, and
    said power terminal has a width greater than that of said control terminal.

4. The power semiconductor device according to claim 1, wherein said IC includes a high voltage integrated circuit (HVIC) and a low voltage integrated circuit (LVIC) that are integrated circuits to control each of said power chips.

5. The power semiconductor device according to claim 1, wherein each of said power chips is any one of a chip including an insulated gate bipolar transistor (IGBT) and a diode, a chip including a metal oxide semiconductor (MOS) transistor, and a chip including a reverse conducting (RC)-IGBT.

6. The power semiconductor device according to claim 1, wherein each of said power chips is made of a wide band gap material.

* * * * *